United States Patent [19]

Baliga et al.

[11] Patent Number: 4,942,445
[45] Date of Patent: Jul. 17, 1990

[54] LATERAL DEPLETION MODE TYRISTOR

[75] Inventors: Bantval J. Baliga, Schenectady; Hsueh-Rong Chang, Scotia, both of N.Y.

[73] Assignee: General Electric Company, Schenectady, N.Y.

[21] Appl. No.: 217,449

[22] Filed: Jul. 5, 1988

[51] Int. Cl.⁵ .................. H01L 29/74; H01L 27/02; H01L 29/78
[52] U.S. Cl. ...................... 357/38; 357/41; 357/43; 357/23.14
[58] Field of Search ................ 357/38, 23.14, 41, 43

[56] References Cited
U.S. PATENT DOCUMENTS 4,779,123 10/1988 Bencuya .................. 357/43
4,786,958 11/1988 Bhagat .................... 357/38
4,799,095 1/1989 Bahga .................... 357/38
4,811,072 3/1989 Risberg .................. 357/38

Primary Examiner—Rolf Hille
Assistant Examiner—Wael Fahmy
Attorney, Agent, or Firm—Robert Ochis; James C. Davis, Jr.; Marvin Snyder

[57] ABSTRACT

A lateral depletion mode thyristor has both of its power electrodes and both of its emitter regions extending to the same surface of the semiconductor wafer. The device operates with both a regenerative current path and a non-regenerative current path. An insulated gate electrode structure is disposed in a trench and configured to pinch off the regenerative current path to force the current flowing therein to transfer to the non-regenerative current path, thereby interrupting the regenerative action within the device and causing it to turn off. In some embodiments, a second insulated gate electrode controls device turn-on.

23 Claims, 13 Drawing Sheets

LATERAL DEPLETION MODE TYRISTOR

RELATED APPLICATIONS

This application is related to U.S. patent applications entitled "Metal Oxide Semiconductor Gated Turn-Off Thyristor", Ser. No. 069,806 filed July 6, 1987; "Metal Oxide Semiconductor Gated Turn-Off Thyristor Including a Schottky Contact", Ser. No. 114,357, filed Oct. 29, 1987; "Metal Oxide Semiconductor Gated Turn-Off Thyristor Including a Low Lifetime Region", Ser. No. 188,888 filed May 2, 1988, all by Bantval J. Baliga, one of the present inventors and a U.S. patent application entitled "Metal Oxide Semiconductor Gated Turn-Off Thyristor Having an Interleaved Structure", Ser. No. 188,887 filed May 2, 1988, by the present inventors, all assigned to the instant assignee. The present invention is an improvement on the inventions described and claimed in those applications. Each of these related applications is incorporated herein, by reference, in its entirety.

FIELD OF THE INVENTION

The present invention relates to four-layer, latching, semiconductor power devices and more particularly, to such devices whose conduction and/or turn-off, may be controlled by the voltage on the insulated gate electrode of a metal oxide semiconductor (MOS) portion of the device.

There are a number of prior art MOS gated four-layer (NPNP) semiconductor devices which will latch into an ON condition when conducting sufficient current. These devices are known as regenerative devices because they latch as a result of internal regeneration in which internal carrier flow associated with the external terminal currents generates more carriers than it consumes because of an internal current gain which is greater than one. The majority of such devices are vertical devices in which the ON-state current flows vertically through the semiconductor wafer. This is because such devices when constructed in a lateral configuration normally suffer from reduced ON-state current density and increased turn-off control difficulties. Lateral regenerative devices with high ON-state current density and positive, assured control of turn-off are desirable.

Accordingly, it is a primary object of the present invention to provide a lateral, latching NPNP semiconductor device in which a MOS gate controls turn-off.

Another object is to provide a MOS-gated lateral thyristor having improved turn-off control.

A further object is to provide a MOS-gated lateral thyristor having an increased current density.

A still further object is to provide a MOS-gated lateral thyristor having an increased turn-off speed.

SUMMARY OF THE INVENTION

In accordance with the present invention, the foregoing objects are achieved by a semiconductor device having a regenerative or thyristor current path in which current regeneration takes place. This regenerative current path extends through first, second, third and fourth regions of alternating conductivity types, arranged in series in that order between first and second power electrodes disposed on the same surface of the semiconductor body. Included in the structure is a non-regenerative current path which also extends between the first and second power electrodes. This non-regenerative current path extends through only three regions of alternating conductivity type. These regions may be the same as the first, second and third regions or the second, third and fourth regions of the regenerative current path. This device includes an insulated gate electrode for, in response to application of an appropriate gate bias voltage, pinching off the regenerative current path to force current to transfer from the regenerative current path to the non-regenerative current path, thereby turning the device OFF.

In one embodiment, the gate electrode is disposed in a trench which extends into the semiconductor body from the surface on which the power electrodes are disposed. A variety of different configurations for the gate electrodes and each of the semiconducting regions are possible. One such configuration involves the first and fourth regions (the emitter regions) extending parallel to each other in a first direction along the surface of the semiconductor body and the gate electrode being disposed in trenches which also extend in the first direction and bound channel portions of one of the second or third (base) regions. Another such configuration has the first region elongated in a first direction along the semiconductor body, the gate electrode comprising a plurality of segments which are spaced apart in the first direction, and channel portions of one of the second or third (base) regions disposed between the gate segments as part of the regenerative current path of the device. In the latter configuration, non-channel portions of the one of the second or third regions may be disposed either between other adjacent pairs of gate segments or beyond the gate electrode segments in a direction perpendicular to the first direction.

One of the base regions may include a channel portion whose conductivity is controlled by a second gate electrode in order to provide turn-on control for the device. In the non-regenerative current path, one of the power electrodes contacts a base region and the nonregenerative current path omits the emitter region which, in the regenerative current path, is disposed between that power electrode and that base region. In addition, if desired, the other power electrode may also contact the other base region at locations which are spaced apart from its contacts to the other emitter region.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
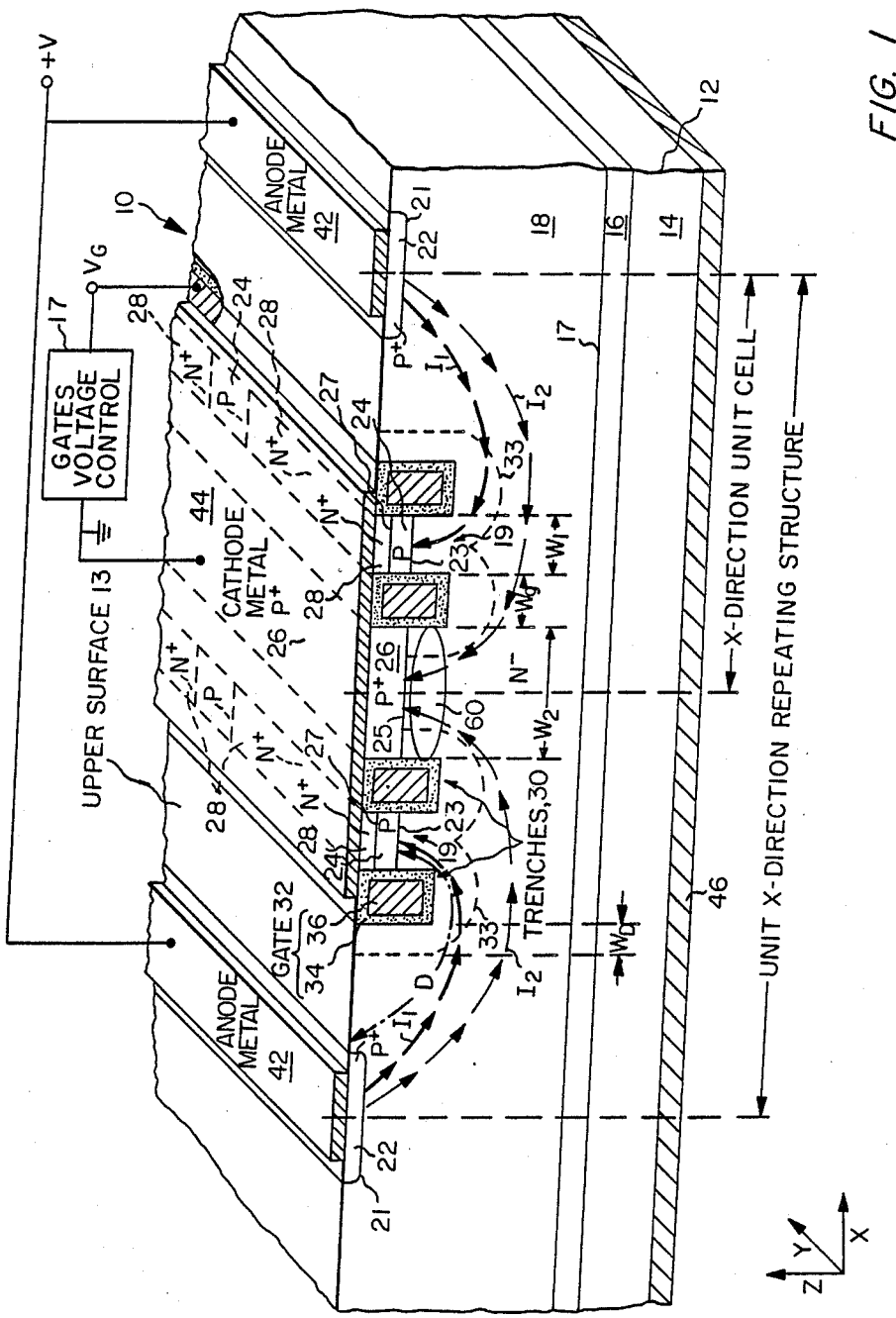
FIG. 1 is a perspective view of an embodiment of a first class of devices in accordance with the present invention.

FIG. 1 illustrates, in perspective view, an embodiment 10 of a first class of devices in accordance with the present invention. An orthogonal XYZ coordinate system is included in the lower left corner of the figure to provide a directional reference within the device structure. The device 10 comprises a semiconductor body 12 having a substrate 14 and an overlying layer 16 on which a lightly doped N type base region 18 is disposed. The layer 16 may be a P type region or an insulating layer such as silicon dioxide. In one class of devices layer 14 may be a lightly or heavily doped P type region. In another class of devices, the substrate may be P type or N type material with layer 16 being an insulating layer disposed between the substrate and the N type base region 18. The N type base region 18 is a layer of semiconductor material which extends to the upper surface 13 of the semiconductor body 12.

A heavily doped P type emitter region 22 extends into the base region 18 from the upper surface 13 of the semiconductor body and forms a PN junction 21 with base region 18. The P+ emitter region 22 is elongated in the Y-direction. In an X-direction unit cell, two trenches 30 are spaced in the X-direction from each other and from the P+ emitter region 22; are elongated in the Y-direction and extend downward from the upper surface 13 of semiconductor body 12 into, but not through, the N type base layer 18. Within each of these trenches, a Y-direction elongated segment of an insulated gate electrode 32 is disposed. Each insulated gate electrode segment 32 comprises an insulating layer 34 disposed in the trench adjacent to the surface of the semiconductor body 12 and a conductor 36 which fills the remainder of the trench. The insulating layer 34 is preferably silicon dioxide formed by oxidation of the surface of the silicon semiconductor body. Each gate electrode segment has an X-direction width $W_g$ which may preferably be 1 to 3 microns. Between the gate electrode segments 32, a main P type base region 24 is disposed adjacent to, and forms a second PN junction 23 with, base layer 18. A plurality of segments of a heavily doped N type (N+) emitter region 28 extend into the semiconductor body from upper surface 13 between the gate electrode segments and form a plurality of segments of a third PN junction 27 with the P type base region 24. At locations which are Y-direction spaced apart by segments of N+ emitter region 28, the main P type base region 24 extends to the upper surface 13 of the semiconductor body.

A channel portion 19 of the N type base region 18 extends upward between the gate electrode segments 32 of the unit cell and has an X-direction width $W_1$ which may preferably be between 2 and 5 microns. Portion 19 is referred to as a channel portion of the base region 18 because $W_1$ is made small enough that application of appropriate gate bias voltages to the gate electrode segments 32 controls the conductivity of that channel region for electrons and can pinch it off to render it non-conductive to electrons. Portion 19, which is elongated in the Y-direction, may also be referred to as a pedestal or mesa portion of the base region.

A P+ portion 26 of the P type base region 24 extends into the semiconductor body 12 from its upper surface 13 and forms a PN junction 25 with base layer 18. In the X-direction repeating structure, the P+ portion 26 is X-direction separated from the P+ emitter region 22 by both of the gate electrode segments 32 and is spaced from P base 24 by one of the gate electrode segments 32. P+ region 26 is a high conductivity portion of the P type base region 24. The PN junction 25 may be an extension of the PN junction 23 if the device topology is designed in such a manner that the P+ region 26 and the P base region 24 are connected at some locations, such as by a break in the gate electrode segments at selected Y-direction locations. In any event, the P type regions 24 and 26 are held at substantially the same potential since each is in ohmic contact with the overlying cathode electrode 44 which is discussed hereinafter. The P+ portion 26 of the P base region is elongated in the Y-direction and has an X-direction width $W_2$ which is substantially greater than the X-direction width $W_1$ of the P base region 24. Width $W_2$ is preferably between 5 and 30 microns in order to prevent a gate voltage which pinches off electron flow in the channel portion 19 of the N type base region 18 from pinching off electron flow in the portion of the N type base region 18 which is directly under the P+ portion 26 of the P type base region.

The minimum distance D through the semiconductor body by which the P+ emitter (anode) region 22 is spaced from the PN junction 23 between P and N base regions is selected in accordance with the maximum voltage the device 10 is specified to hold off across its anode/cathode terminals without breaking down.

An anode power electrode 42 is disposed on P+ emitter region 22 in ohmic contact therewith. A cathode electrode 44 is disposed on and in ohmic contact with the N+ emitter region 28 and in ohmic contact with the portion of the P type base region 24 which extends to the upper surface of the semiconductor body and the P+ portion 26 of the P type base region.

Device 10 is connected in a circuit with the cathode metal 44 connected to ground, the anode metal 42 connected to a positive voltage V and the gate electrode connected to a gate voltage control circuit 17 for applying a gate voltage Vg to gate electrode 32 for controlling the conductive state of device 10.

The X-direction repeating structure illustrated in FIG. 1 comprises two X-direction unit cells which are mirror images about the center line of the X-direction repeating structure. An alternative X-direction repeating structure (not shown in full) would extend from the center line of one cathode metal segment 44 to the center line of the next cathode metal segment 44.

In operation, the cathode electrode 44 is held at ground voltage and the anode electrode 42 is biased positive relative to the cathode electrode. Where the layer 16 is a P— layer, the substrate 14 is biased, via electrode 46 in ohmic contact therewith, with a negative voltage relative to the cathode in order to reverse bias the PN junction 17 between the layer 16 and the layer 18 to thereby minimize current flow into the substrate.

Device 10 may be turned ON utilizing any of a variety of well known techniques for turning on a thyristor, including those discussed and described in the above-identified related patent applications. Once the device is turned ON and operating in a regenerative mode, regenerative current flows in the current path which is schematically illustrated by bold or dark arrows and identified as $I_1$. Some current will also flow in the non-regenerative current path which is schematically illustrated by light or narrow arrows and identified as $I_2$. Throughout the figures, current paths shown by bold arrows are (at least potentially) regenerative since they extend through a PNPN structure, while current paths shown by light arrows are non-regenerative because they extend at most through a three layer structure such as a PNP structure. In device 10, the regenerative current path $I_1$ is shorter than the non-regenerative current path $I_2$.

In order to turn device 10 OFF, a turn-off gate voltage which is negative relative to the cathode electrode and of an appropriate magnitude is applied to the gate electrode segments 32. Application of this voltage to the gate electrode segments induces the formation of depletion regions in the N type base region 18 around the gate electrode segments. As illustrated in FIG. 1 by the dashed lines 33, these depletion regions have a width $W_D$ which is greater than $W_1/2$ and thus are wide enough that they merge in the channel portion 19 of the N type base region 18, thereby pinching off that portion of the base region. $W_D$ is also sufficiently less than $W_2/2$ to ensure that the pedestal portion of the N type base region under P+ portion 26 of the P base is not pinched off by the turn-off gate voltage. Since the applied gate turn-off voltage is negative and region 18 is doped N− type, it will be understood that the depletion regions are free of mobile electrons. Thus, once the depletion regions merge, the channel portions 19 are pinched-off to electron flow. However, hole flow is not blocked by this pinched-off condition of the N− type base region. The pinch-off of channel portions 19 blocks electron flow in the primary regenerative current path $I_1$. As a result, the PNP transistor comprised of regions 24, 18 and 22 is deprived of its electron base current. This results in the PNP transistor turning off and prevents regeneration, thereby resulting in turn-off of the thyristor. This reduces the hole injection from P+ emitter 22 since the only electrons which will cross that junction are those which are stored in the N base 18. At the same time, the concentration of electrons in P base 24 increases until the PN junction 27 is no longer forward biased and stops injecting electrons into P base 24. That electron concentration increase is a result of the pinched-off condition of channel portions 19 preventing electrons injected into P base 24 by N emitter 28 from leaving P base 24 via N base 18. The blocked electron current in channel portions 19 is also the collector current of the NPN transistor comprised of regions 28, 24 and 18. Consequently, the current gain of the NPN transistor becomes zero since it has no collector current. Charge neutrality is maintained in P base 24 during this time by an influx of holes which continue to flow through the channel portions 19 into P base 24 as necessary to maintain charge neutrality. Under these conditions, the majority of holes stored in the N base 18 will cross the PN junction 25 into P+ portion 26 of the P base because holes are more strongly attracted into the P+ portion 26 than into P portion 24 because portion 26 is at a less positive voltage than those portions of P base 24 which are remote from the ohmic contact between the P base 24 and the cathode metal 44.

Consequently, current flow is transferred from the regenerative current path $I_1$ into the non-regenerative current path $I_2$. The existence of this non-regenerative current path and its continuing conductivity during pinch off of the regenerative current path enable the pinch-off mechanism to turn OFF the regenerative current flow at a lower gate voltage than might be required in the absence of this alternative current path. Turn-off of this device can be expedited by including a low lifetime region 60 in the N type base region 18 in a location through which the non-regenerative current path extends, but which is spaced from the regenerative current path. In this way, the low lifetime region expedites turn-off by speeding recombination of stored charge in the N type base region 18 without adversely affecting the ON-state resistance of the regenerative current path or the ON-state voltage drop of device 10.

The depth to which the trenches 30 extend into the N type layer 18 must be limited to ensure that the application of the pinch-off voltage to the gate electrode segments 32 does not pinch-off electron flow in the portion of the base region 18 which is situated between those gate electrode segments and layer 16 either completely or to a sufficient extent to severely increase the resistance of the non-regenerative current path $I_2$ since such pinch-off could interfere with proper turn-off of the device.

Figure 2:
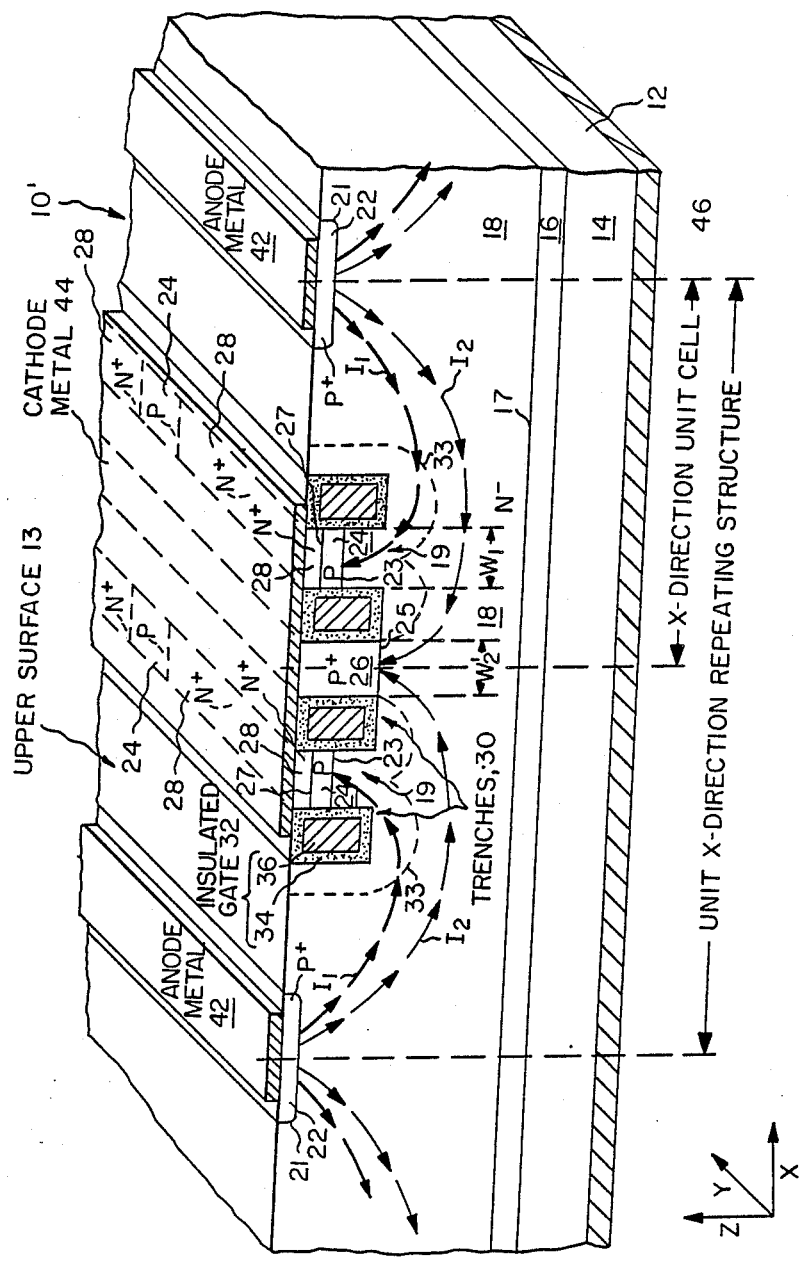
FIGS. 2-4 illustrate modified versions of the FIG. 1 embodiment.

In FIG. 2, a modified version 10' of the device 10 of FIG. 1 is illustrated in which the X-direction width $W_2'$ of the P+ region 26 is made more nearly equal to the X-direction width $W_1$ of the channel portion 19 of the N type base region 18. This allows an increase in the number of unit cells in a given X-direction width of the active portion of the device and thus enables an increase in ON-state current per unit area. In order to prevent pinch-off of the non-regenerative current path in this structure, the P+ region 26 is extended deeper into the layer 18 than the main P type base 24 and in particular, to the same depth as the bottom of the gate trenches 30. In this manner, the gate bias is prevented from pinching off the non-regenerative current path $I_2$ as is illustrated by the path taken by current $I_2$ around the outside of the depletion region represented by the dash lines 33. The device 10' is otherwise structurally and operationally similar to the device 10 of FIG. 1.

Figure 3:
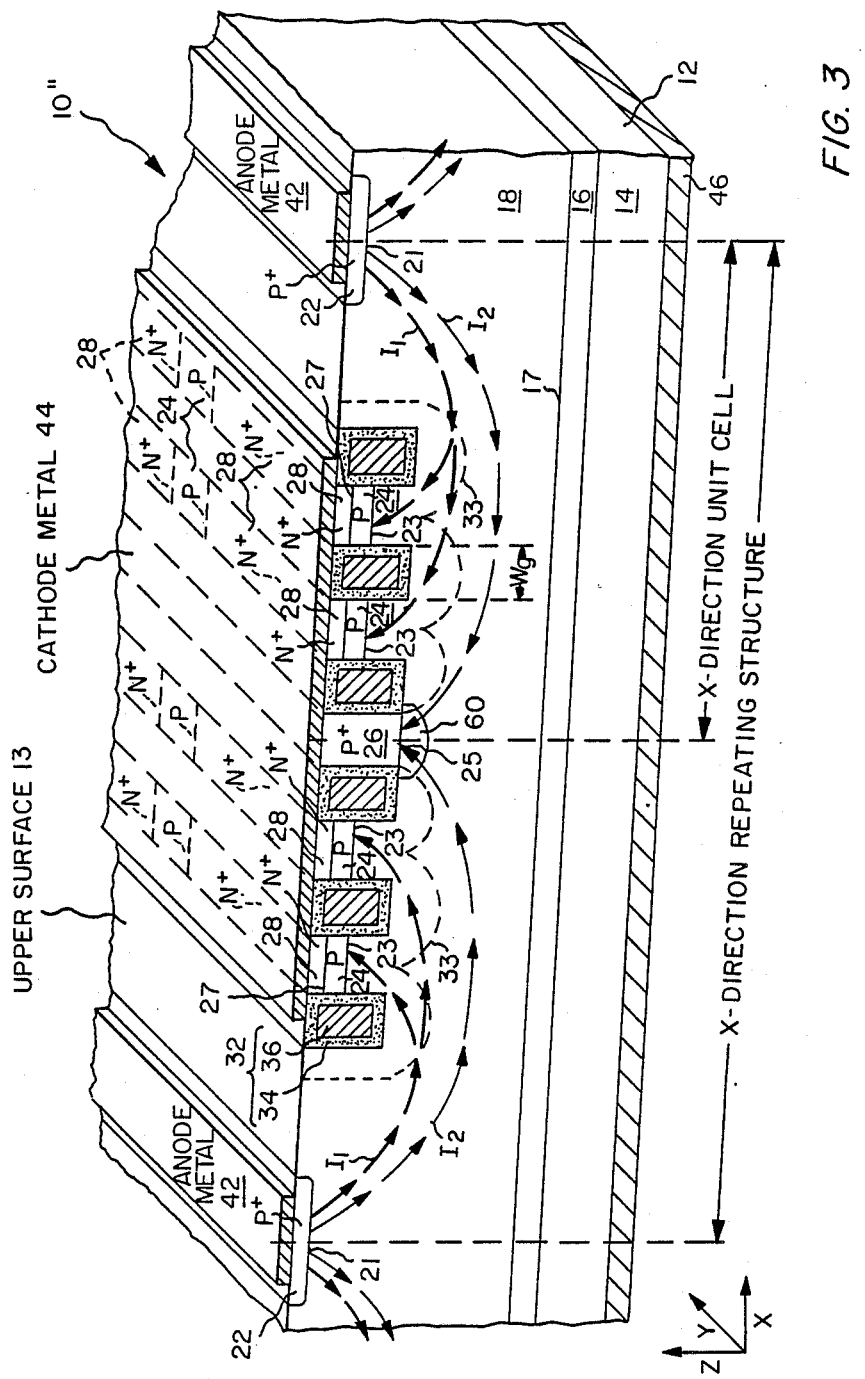

A second modified version 10'' of device 10 of FIG. 1 is illustrated in FIG. 3. The device 10'' is like the device 10' of FIG. 2 except that the number of channel portions 19 of the base region 18 which are contained in each unit cell is doubled. This increases to four the number of channel portions 19 in each unit X-direction repeating structure. Each X-direction repeating structure contains a single P+ region 26. Consequently, this modification increases the portion of the device structure which is devoted to regenerative current flow and lengthens the non-regenerative current path $I_2$, since the P+ portion 26 of the base region is spaced from the anode region 22 by a distance which is increased by $(W_g+W_1)$.

This use of multiple regenerative segments in each unit cell enables the average current density in the device to be increased since the X-direction width in FIG. 3 of each regenerative segment is limited by the need to be able to pinch off the channel portions 19 to turn the device off. Consequently, by including a number of the regenerative segments in each unit cell, the average current density in the device can be maximized. There is no similar limitation on the X-direction width of the P+ anode region 22. As the number of regenerative sections per unit cell is increased, it may be desirable to make non-regenerative section 26 wider than the regenerative segments, as in the device 10 in FIG. 1, since the P+ portion 26 of the base region is free of maximum-width limitations of the type to which the channel portions 119 are subject. The specific number of regenerative segments and the width of the P+ region 26 in each X-direction repeating structure is a matter of design choice which is governed by trade-offs among such variables as the average length of the regenerative current path, the minimum length of the non-regenerative current path, design rules as to sizes of regions, spacings among regions, sizes of metallizations and so forth.

Figure 4:
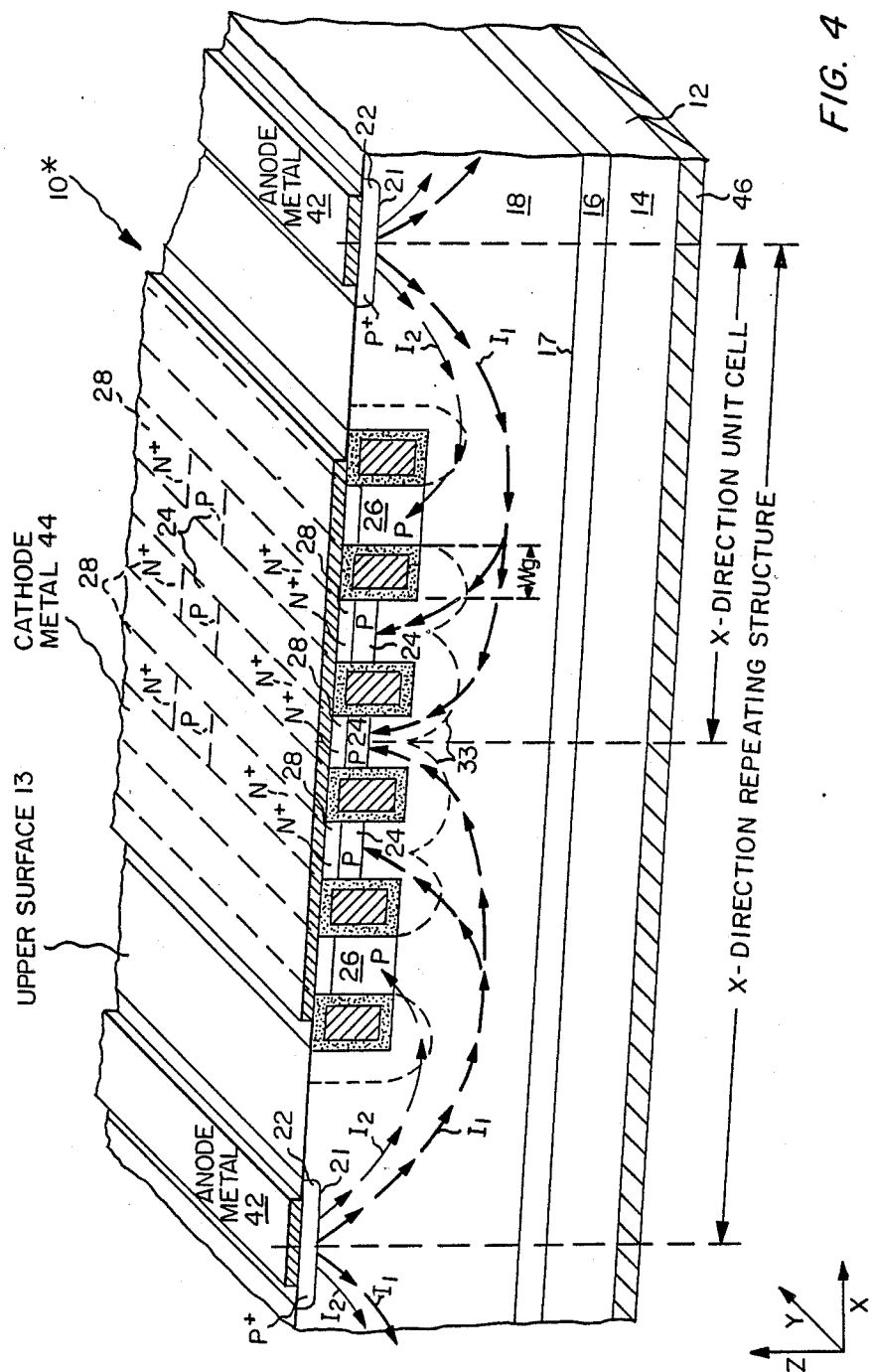

A third modified version 10* of device 10 is illustrated in FIG. 4. The device 10* is like the device 10' of FIG. 2 except for inclusion of a P+ region 26 between the pair of gate segments which is closest to the anode region 22 rather than at the X-direction center of the X-direction repeating structure. As a result, in the device 10*, the regenerative current path $I_1$ is longer than the non-regenerative current path $I_2$ and a smaller portion of the device area is devoted to regenerative current flow, since there are two P+ regions 26 per X-direction repeating structure rather than one. Device 10" of FIG. 3 is preferred over device 10* because better device operating characteristics are provided by a shorter regenerative current path and a larger regenerative area. Further, since the regenerative current path extends past the termination of the non-regenerative current path in device 10*, an increased percentage of current can be expected to flow in the non-regenerative current path as compared to device 10" of FIG. 2. However, this increase in non-regenerative current may be minimized or overcome if the width of, and doping level in, the P type base region portion 26 in the non-regenerative current path are properly selected since, under appropriate conditions, a positive voltage applied to the gate electrode while the device is in the ON-state can then pinch off the portion 26 of the non-regenerative current path. The applied positive gate voltage must not be large enough to create an inversion layer channel along the surface of the P type base region 24. This technique can be applied to any of the other configurations as well and is explained more fully in the above-identified related application entitled "Metal Oxide Semiconductor Gated Turn-Off Thyristor Having an Interleaved Structure".

Figure 5:
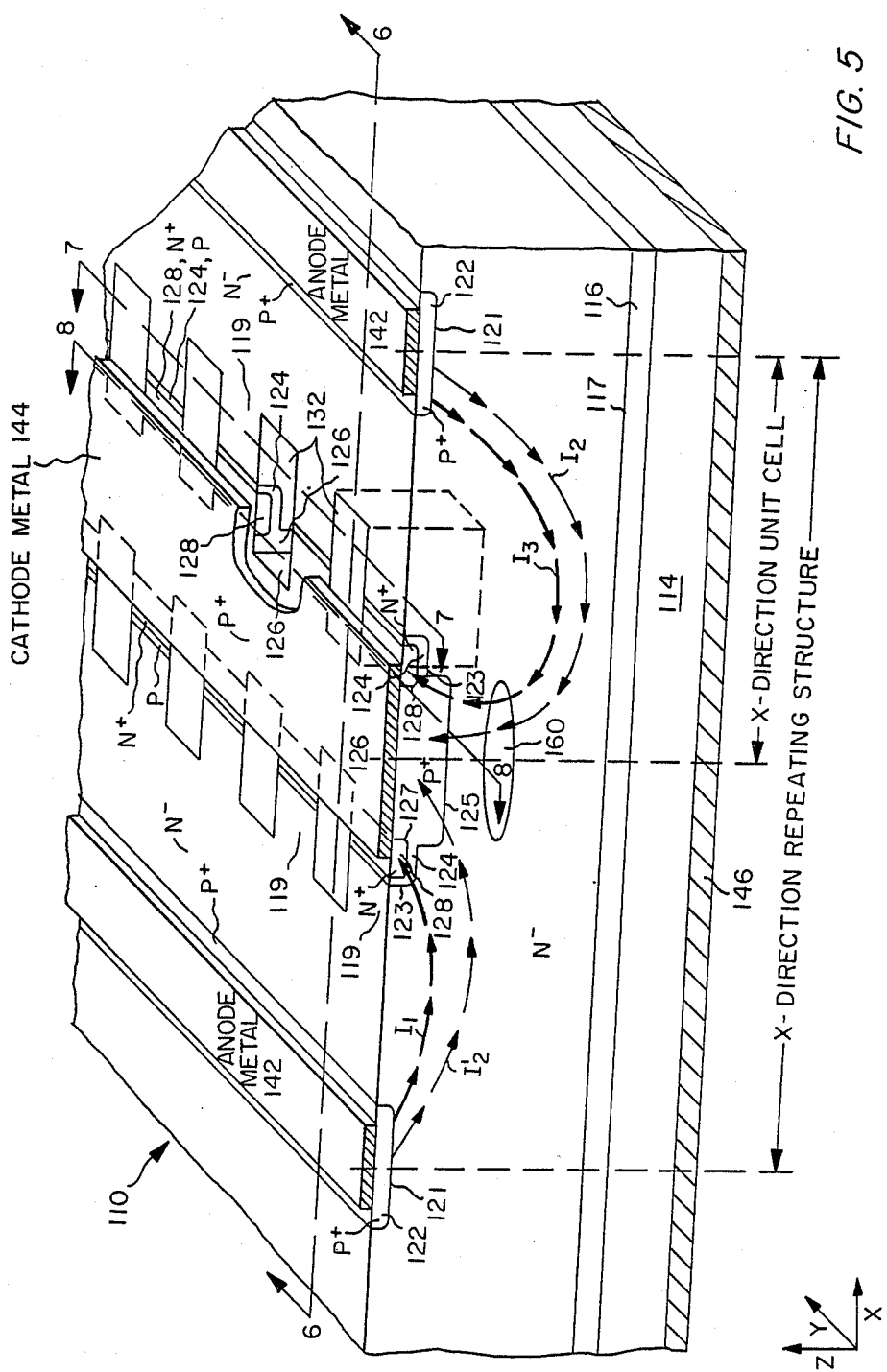
FIG. 5 is a perspective view of an embodiment of a second class of devices in accordance with the present invention.
Figure 6:
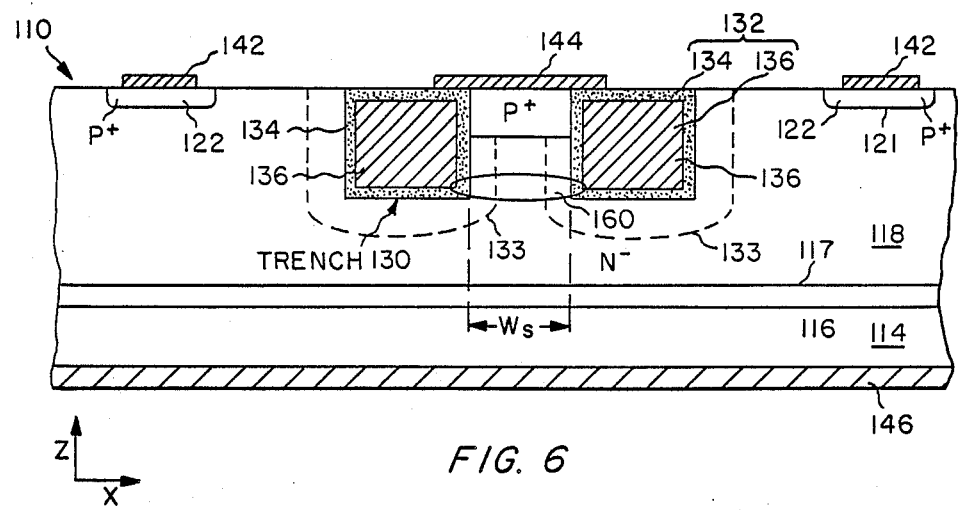
FIGS. 6-8 are cross-sections through the FIG. 5 device taken along lines 6—6, 7—7 and 8—8, respectively.
Figure 7:
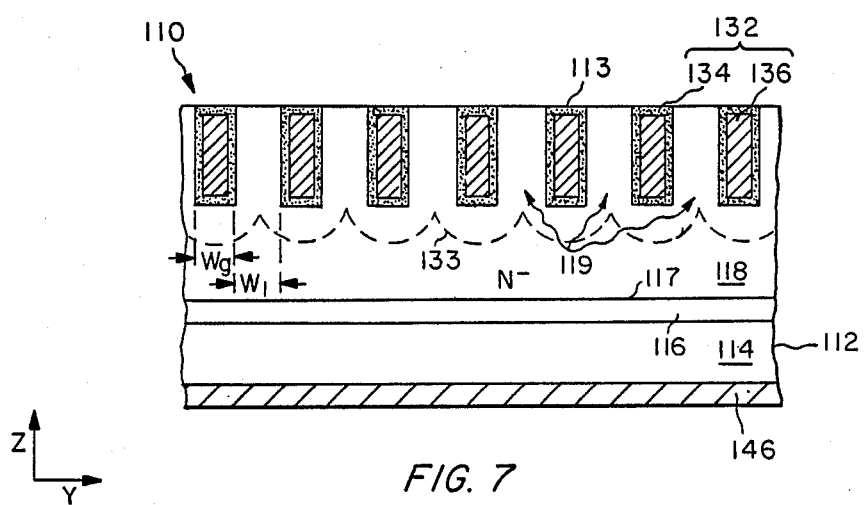
Figure 8:
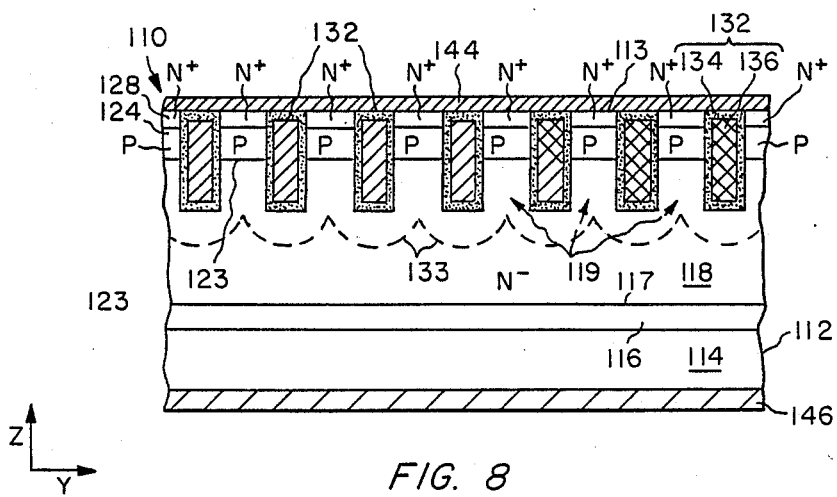

An embodiment 110 of a second class of devices in accordance with the present invention is illustrated in perspective view in FIG. 5 and in cross-section in FIGS. 6–8. The device 110 is, in many ways, similar to the device 10 of FIG. 1 and corresponding regions in device 110 have been given reference numerals which have been increased by 100 as compared to the corresponding region in device 10. Those regions which are unchanged in function are not discussed here and the reader is referred to the discussion of earlier figures for an explanation of their configuration and function.

In device 110, the P+ emitter region 122 is elongated in the Y-direction and spaced in the X-direction from the gate electrode segments 132, the P base region portions 124 and 126 and the N type emitter region 128. Within the unit cell, the gate electrode trenches 130 (FIG. 6) and the gate electrode segments 132 are each segmented in the Y-direction and spaced uniformly apart in the Y-direction. These gate electrode segments define channel portions 119 of the base region having a Y-direction width $W_1$ (FIG. 7) which is preferably 2 to 5 microns. The P type base region 124 is also segmented in the Y-direction (FIG. 8) with each segment disposed between two Y-direction adjacent gate segments 132 and adjacent to and forming a PN junction 123 with the channel portion 119 of base 118 which extends between those same two gate segments. The high conductivity portion 126 of the base region has segments which extend in the X-direction into the region where, in the Y-direction, they are between the gate segments 132 and also includes a portion which is X-direction displaced from the gate electrode segments 132 and continuous in the Y-direction. The Y-direction continuous portion of P+ region 126 has an X-direction width $W_s$ (FIG. 6) where it spaces apart gate electrode segments of adjacent (mirror image) unit cells. The width $W_s$ is preferably between 5 and 30 microns and corresponds in function to the width $W_2$ in device 10 of FIG. 1. The N+ emitter region 128 is divided into segments which are spaced apart in the Y-direction by the gate electrode segments 132 (FIGS. 5 and 8).

An anode electrode 142 is disposed in ohmic contact with the P+ emitter 122 and a cathode electrode 144 is disposed in ohmic contact with the N+ emitter region 128 and the portion 126 of the P type base region.

In operation, the primary ON-state regenerative current path $I_1$ (shown in the lefthand side of FIG. 5) extends directly from the anode emitter region 122 to the cathode emitter region 128 through the channel portion 119 of the N type base region 118 between the gate electrode segments 132 and the P type base region 124. There is also an ON-state non-regenerative current path $I_2'$ (shown in the lefthand side of FIG. 5) which extends substantially parallel to the regenerative current path from the P+ emitter region 122 to the high conductivity portion 126 of the P type base region and thence to the cathode electrode 144.

When it is desired to turn device 110 OFF, a negative voltage is applied to the gate electrode segments 132 to pinch off electron flow in the channel portions 119 of the base region 118. This blocks electron flow in the primary regenerative current path $I_1$ and the corresponding portion of the non-regenerative current path $I_2'$. Blocking of the electron flow in the regenerative current path prevents regeneration in the P-type emitter region/N type base region PN junction 121 which is the source of the holes which flow through the channel region 119. As illustrated in the righthand side of FIG. 5, a non-regenerative current path $I_2$ extends below the gate electrode segments 132 and the pinched-off channel portion of the base region 118. There is also a secondary regenerative current path $I_3$ (righthand side in FIG. 5) which extends underneath the gate electrodes and the pinched-off channel portion of the base region 118 and up through the P+ portion of the base region to the N+ emitter region 128. The individual transistor current gains or $\alpha$'s for secondary regenerative current path $I_3$ are affected by the distance by which the gate electrode segments extend past the N+ emitter region 128 and by the doping concentration in the portion of the P type base region through which this regenerative current path extends.

In the structure shown in FIG. 5 in which the gate electrode extends in the X-direction all the way through the N+ emitter region 128 and the moderately doped portion 124 of the P− type base region and into the heavily P doped portion 126 of the base region (as best seen in the gate trench which is shown without a gate electrode in it), the gain of the regenerative current path $I_3$ is low because that path is forced into the very high doping level P+ portion 126 of the base which minimizes the injection efficiency and base transport factor of the parasitic N+P+N− transistor constituted by regions 128, 126 and 118, respectively. In contrast, if the gate electrode extends, in the X-direction, only partway through the N+ emitter region 128 and the portion 124 of the P type base region, the $I_3$ current path will extend from N type base 118 through portion 124 of the P type base region into the N+ emitter region and the parasitic transistor is an N+PN− transistor which has better injection efficiency and base transport factors than an N+P+N− transistor. Therefore, it is preferred to have a gate configuration which forces the $I_3$ current path into the P+ portion of the base region. However, design trade offs may be made between X-direction width of the unit cell and the gain of the $I_3$ current path which may result in an increased $I_3$ current gain while still providing an $I_3$ gain of less than one.

The existence of the regenerative current path $I_3$ will not prevent turn-off of this device as a result of pinch off of the channel portion 119 of the base region 118 provided that the sum of the α's for this current path is less than one. These α's may be reduced in several ways. One way is to provide a low lifetime region 160 in the part of the N type base region 118 where both the current paths $I_2$ and $I_3$ extend upward beyond the pinched-off channel portion of the base region. A low lifetime region may be created in a number of ways. More details on the use of and creation of low lifetime regions is contained in the related application "Metal Oxide Semiconductor Gated Turn-Off Thyristor Including a Low Lifetime Region". Similarly, a reduced lifetime portion of the P type base region in the same vicinity will aid in reducing the α's for this current path. Also, the doping level in the portion of the P type base region through which the regenerative path $I_3$ passes will affect the α's for this current path independent of the presence of low lifetime regions.

Figure 9:
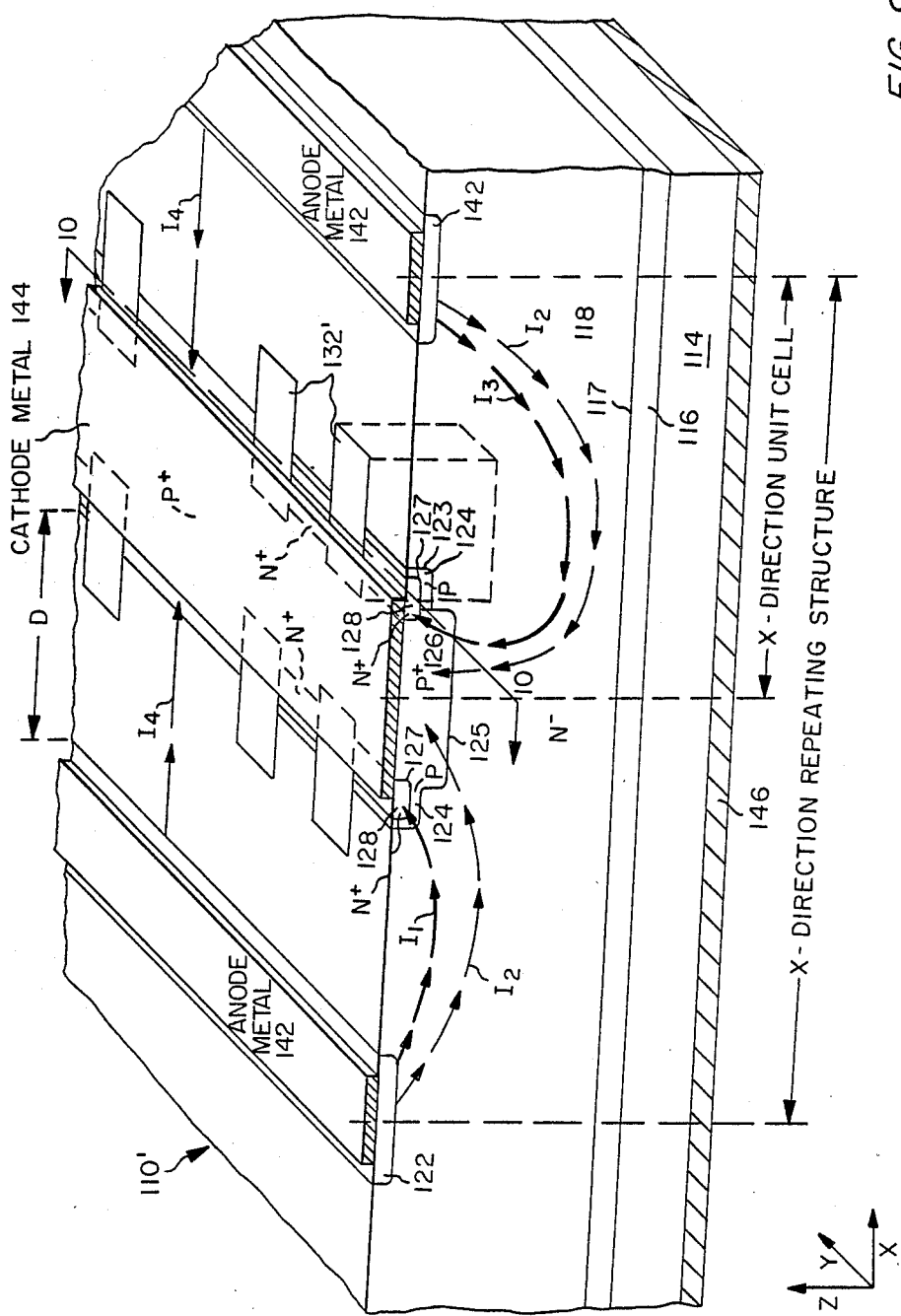
FIG. 9 is a perspective view of a modified version of the FIG. 5 device.
Figure 10:
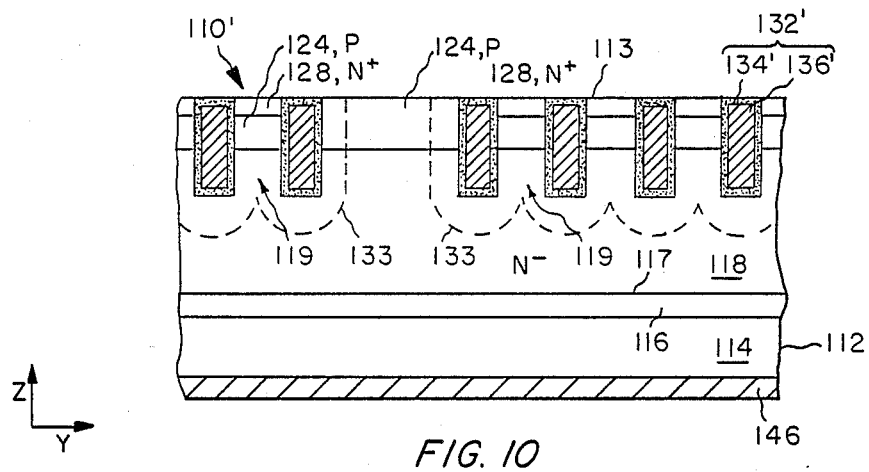
FIG. 10 is a cross-section through the FIG. 9 device taken along the line 10—10.

A modified version 110′ of the device structure 110 shown in FIG. 5 is illustrated in perspective in FIG. 9 and in cross-section in FIG. 10. The structure of device 110′ is similar to that of device 110 except that the Y-direction spacing of the trench gates 132′ is non-uniform, with some Y-direction adjacent gate electrode segments spaced far enough apart to prevent pinch off of the N type base region between those adjacent gate segments (FIG. 10). The N+ emitter region 128 is omitted at those locations where the N-type base region will not pinch off (FIGS. 9 and 10) in order to provide an additional non-regenerative current path $I_4$ in this device as compared to device 110. The non-regenerative current path $I_4$ is conductive in both the ON-state and during pinch-off of the regenerative path $I_1$. This modified structure reduces the regenerative current path cross-sectional area per unit of semiconductor body surface area in order to increase the non-regenerative current path cross-sectional area per unit of semiconductor body surface area to further reduce the efficacy of the secondary regenerative current path $I_3$.

Figure 12:
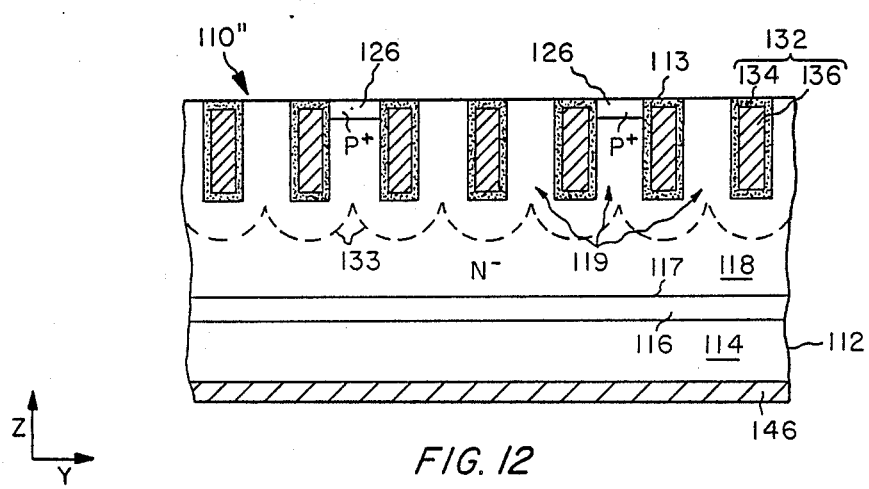
FIGS. 12 and 13 are cross-sections through the FIG. 11 device taken along the lines 12—12 and 13—13, respectively.
Figure 13:
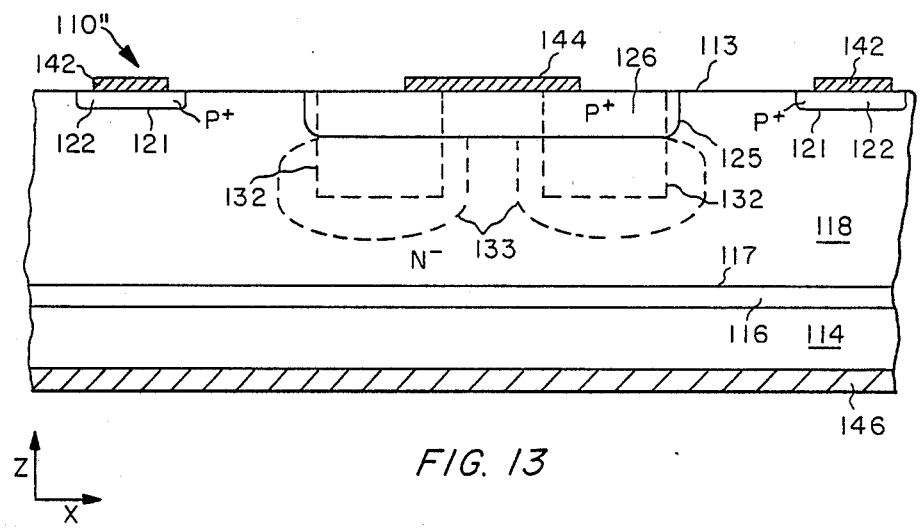
Figure 11:
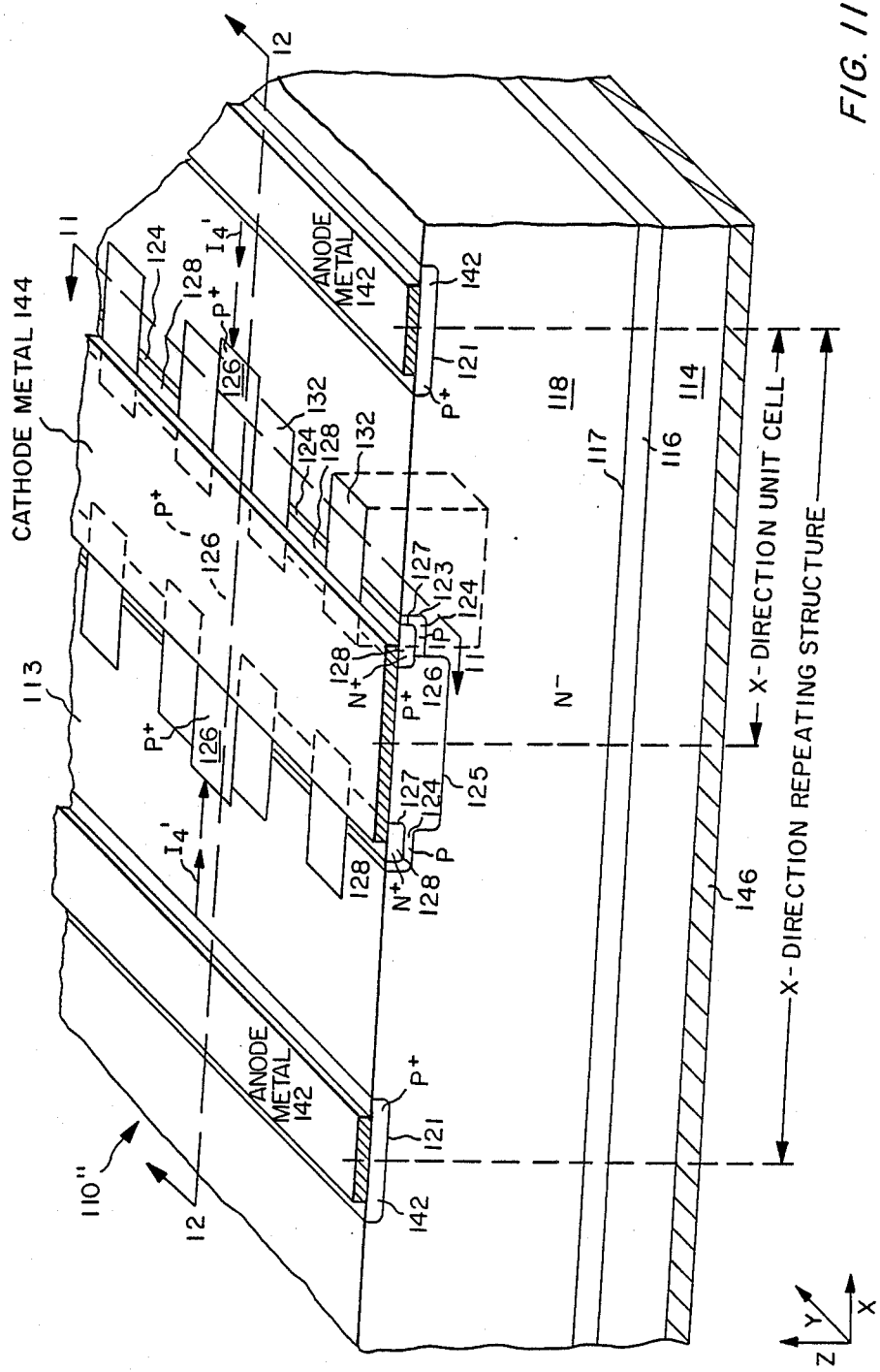
FIG. 11 is a perspective view of a further modified version of the FIG. 5 device.

A further modified version 110″ of device 110 is shown in perspective in FIG. 11 and in cross-section FIGS. 12 and 13. Device 110″ is similar to device 110 in having uniform, Y-direction gate spacing and at the same time, is similar to device 110′ in having portions $I_4'$ of the non-regenerative current path disposed between some adjacent ones of the gate electrode segments. This is accomplished in a manner similar to that in device 10′ of FIG. 2 in that between selected pairs of gate segments the high conductivity portion 126 of the P type base region is extended in the X-direction toward the P+ emitter 122 to the same extent as the gate segments 132 in order to prevent the pinch-off of the portion of the base region between the gate electrode segments 132 from blocking the non-regenerative current path $I_4'$.

In operation, devices 110′ and 110″ operate in a manner which is similar to device 110.

Figure 14:
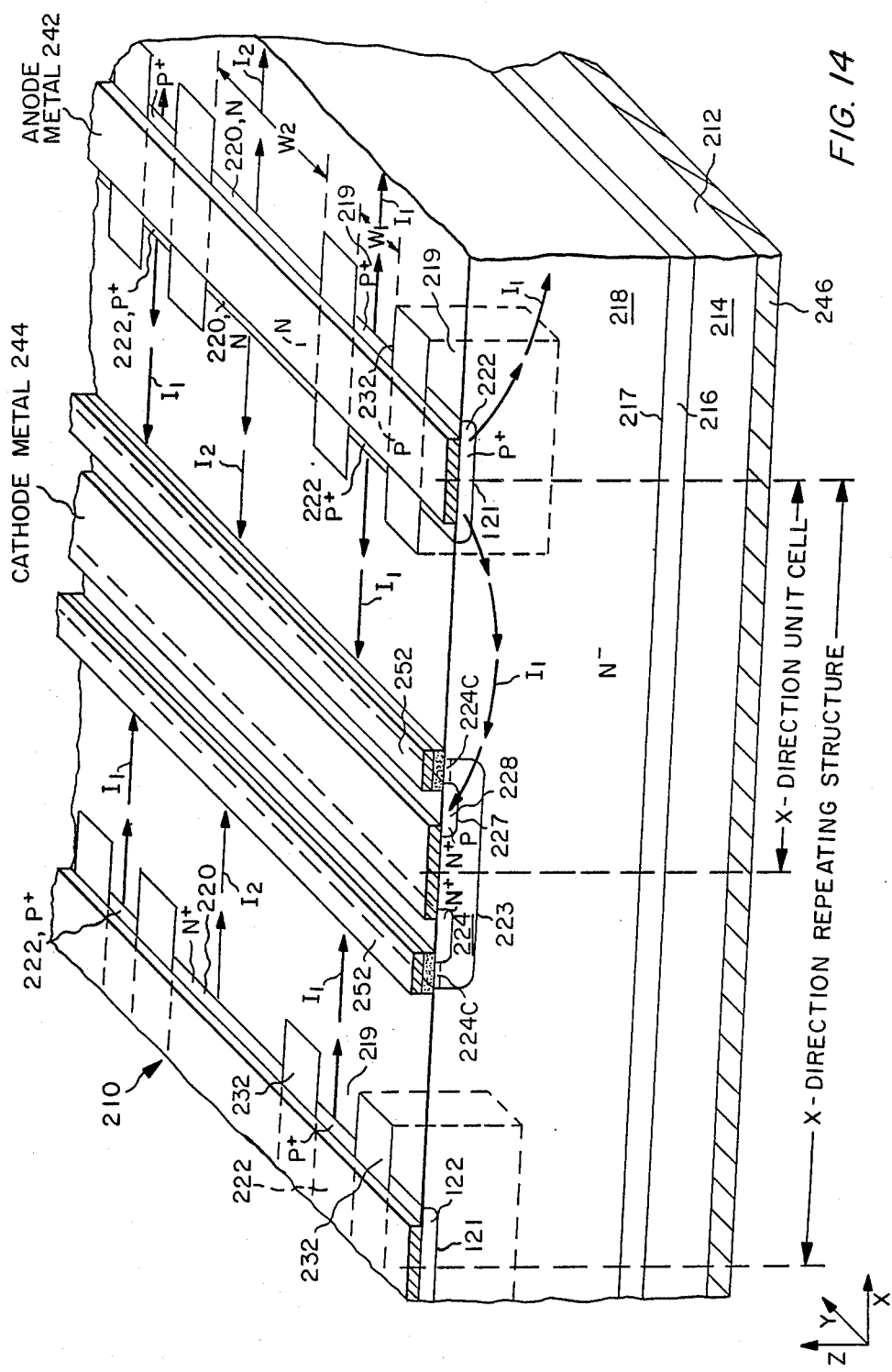
FIG. 14 is a perspective view of an embodiment of a third class of devices in accordance with the present invention.

An embodiment 210 of a third class of devices in accordance with the present invention is illustrated in perspective view in FIG. 14. In device 210, regions which correspond to those in device 10 of FIG. 1 have been given reference numerals which have been increased by 200 relative to the corresponding region in device 10. Those regions which are unchanged in function are not discussed here and the reader is referred to the discussion of earlier figures for an explanation of their configuration and function. In device 210, the P base region 224, the N+ emitter region 228 and the cathode electrode 244 are each elongated in the Y-direction and continuous in that direction. Anode electrode 242 is also elongated in the Y-direction. However, the P+ emitter region 222, rather than being continuous in the Y-direction, comprises a plurality of segments which are spaced apart in the Y-direction. The gate electrode structure 232 comprises a plurality of segments which, in the Y-direction, are spaced apart and, in the X-direction, span the P+ emitter region 222. Between some Y-direction adjacent gate electrode segments, the P+ emitter region 222 is omitted and the anode electrode 242 is in contact with the N type base region 218. This contact may be either an ohmic contact or a Schottky contact. In this embodiment, the Y-direction width $W_2$ of the portions in which the N type base region contacts the anode electrode is greater than the Y-direction width $W_1$ of those portions where the P+ emitter region 222 is present. In device 210, a second insulated gate electrode 252 is disposed over a channel portion 224c of the P type base regions 224. The gate electrode 252 may be disposed on the planar portion of the semiconductor body as shown, or may be disposed in a trench, if desired. The insulated gate 252 may be used to control turn-on of this device while the gate electrode structure 232 controls turn-off. In this device, the regenerative current path $I_1$ extends in the X-direction from the P+ emitter 222 to the N+ emitter 228. At a different Y-direction location, the non-regenerative current path $I_2$ extends from the anode electrode 242 directly to the N type base and on to the cathode electrode 244. If the cathode electrode makes ohmic contact to the P base region 224, as shown, then there is only a diode present in the non-regenerative current path and this device can only block voltage in one polarity. On the other hand, if the cathode electrode 244 contacts only the N+ emitter region 228 and not the P type base region 224, or if the anode electrode forms a Schottky contact to base region 218, then this device can block voltage in both polarities.

In operation, this device is turned ON by applying, to the ON-gate 252, a positive voltage relative to the cathode electrode to induce in the channel region 224c of the P type base region 224 a channel which is conductive to electrons. As a consequence, electrons flow from the N+ emitter region 228 through the channel region 224c into the N type base region 218 where they provide base current for the PNP transistor (regions 224, 218 and 222) of the regenerative structure. Once sufficient charge is built up in the N type base region 218, the bias may be removed from the ON-gate 252 with the result that the device will immediately enter the regenerative mode of operation in the regenerative current path $I_1$.

Turn-off of this device is controlled in a manner similar to that of the previously discussed devices. To turn the device OFF, a negative voltage is applied to the gate electrode segments 232 to pinch off the channel portions 219 of the N type base region 218 disposed between adjacent gate electrode segments and thereby force current flow to transfer from the regenerative current path $I_1$ to the non-regenerative current path $I_2$. This interrupts the regenerative action and causes the device to turn OFF.

Figure 15:
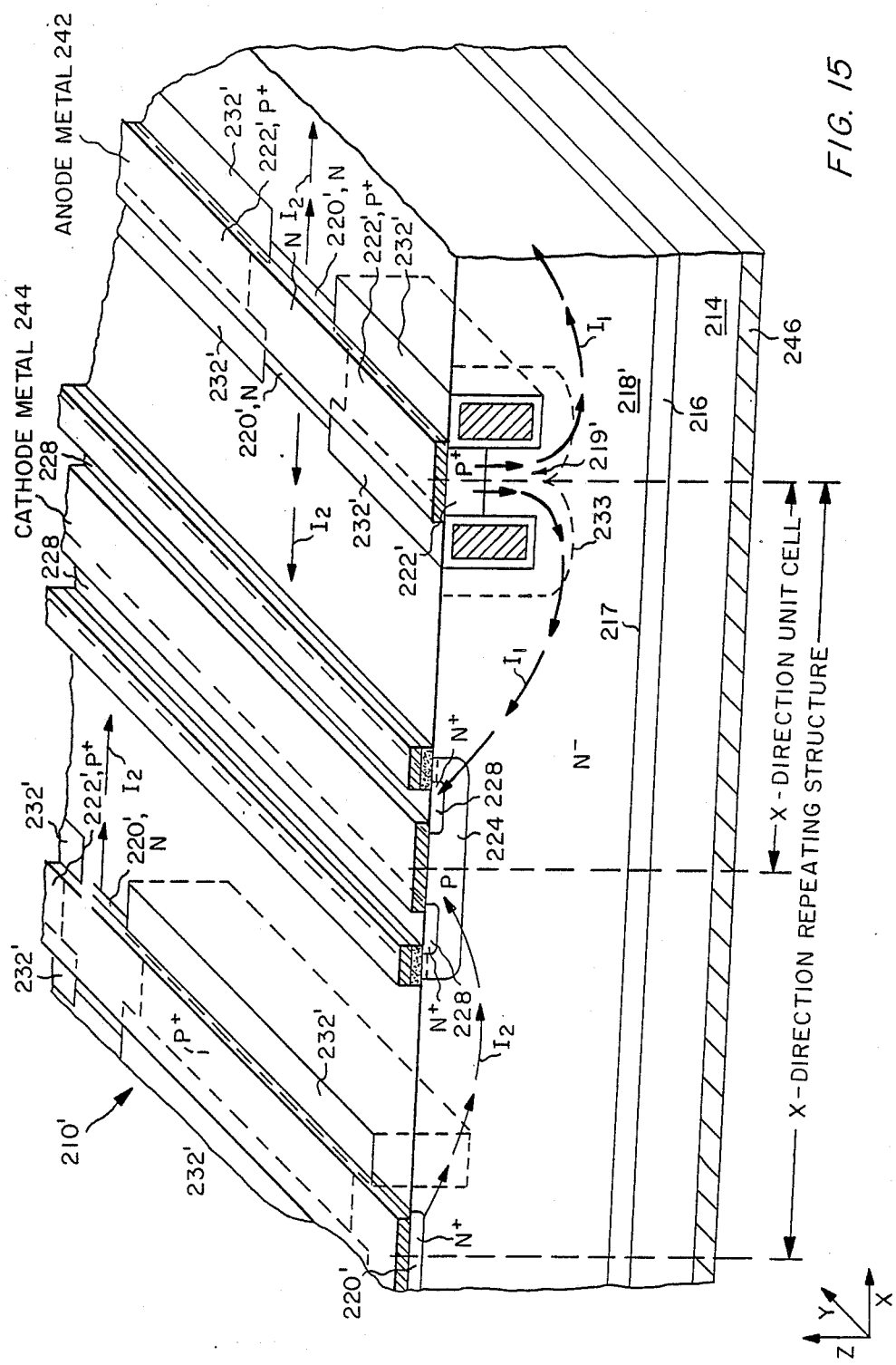
FIG. 15 is a perspective view of a modified version of the FIG. 14 device.

A modified version 210' of the device 210 is illustrated in perspective view in FIG. 15. The device 210' is similar to the device 210 of FIG. 14 except (1) that there are two gate electrode segments 232', each of which is elongated in the Y-direction, (2) the channel portions 219' of the N type base region are X-direction bounded by these gate segments and (3) the regenerative current path $I_1$ extends under the gate electrode segments 232. At Y-direction spaced apart locations, the gate trenches and the gate electrode segments 232' are omitted so that N type base region 218' extends to the surface in those regions into contact with the anode electrode in order to provide a non-regenerative current path $I_2$. This device operates in a manner similar to that of device 210, but may provide a higher regenerative current density per unit of semiconductor surface area as a result of an increase in the P+ emitter region area.

Figure 16:
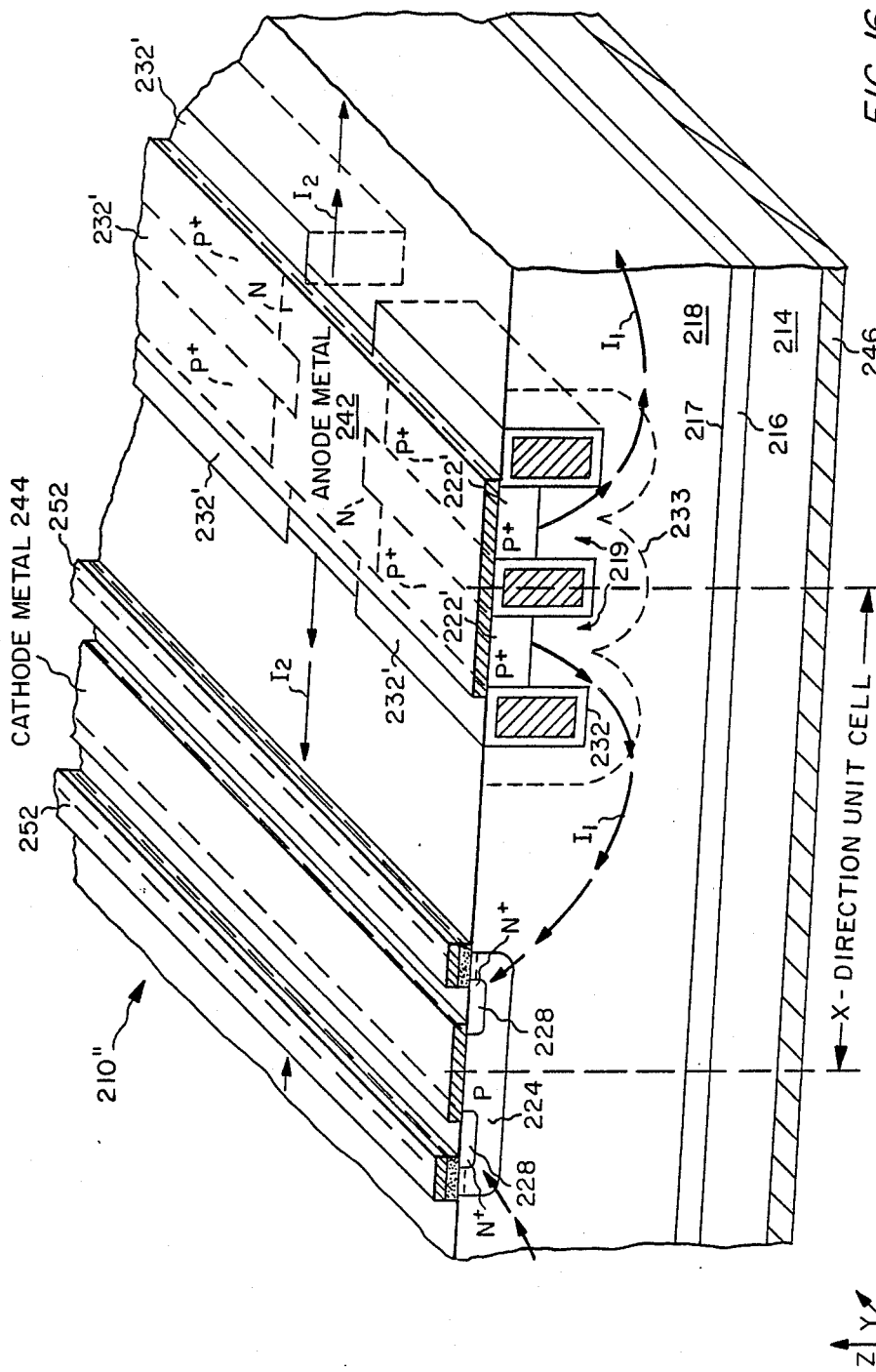
FIGS. 16 and 17 are perspective views of modified versions of the FIG. 15 device.

A modified version 210" of the device 210' is illustrated in perspective in FIG. 16 which illustrates more than an X-direction unit cell, but less than an X-direction repeating structure. The device 210" is like the device 210' of FIG. 15, except for having three Y-direction oriented gate electrode segments 232' at each anode location. As a result of this modification, the anode region 222' has twice the area in device 210" as compared to its area in the device 210'. This is beneficial for reasons which were explained previously in connection with FIG. 3.

Figure 17:
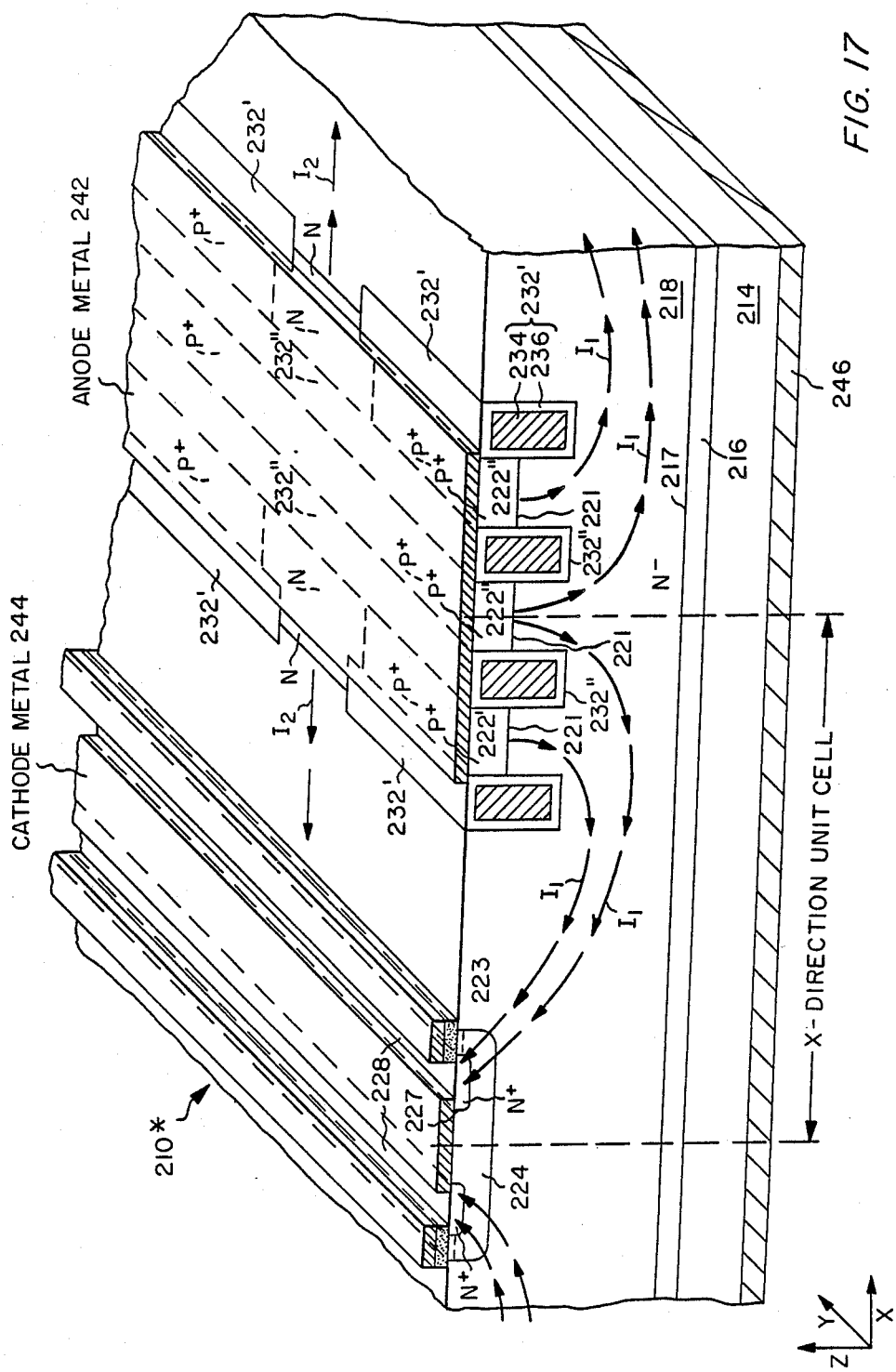

A further modified version 210* of the device 210' of FIG. 15 is illustrated in FIG. 17. In the device 210*, each anode metallization segment has four gate electrode segments and three anode region segments 222' and 222" associated therewith. The structure associated with each outermost pair of gate electrode segments is substantially the same as that in device 210" of FIG. 16. However, in the central portion under the anode metallization 242, the two inner gate electrode segments are continuous in the Y-direction as is the P+ region segment 222" therebetween. This is because the non-regenerative current path $I_2$ flows directly from the N type portion contacted by the anode metallization in the gap in the outermost gate electrode segments 232'. The presence of the central P+ region 222" provides a further increase in the area of the device devoted to regenerative current flow and the lack of a gap in the P+ region 222" provides a further increase as compared to a similar structure in which the gate electrode gap is continued across all of the anode segments. It will be apparent to those skilled in the art, that additional segments like the segments 222" may be included in this structure merely by adding additional Y-direction extending gate electrode segments 232" along the X-direction center of the anode metallization. Here again, as was the case with the multiple segment structure of FIG. 3, the number of such segments is a matter of engineering choice in accordance with specific characteristics of the device configuration and the desired operating characteristics.

The conductivity types of all regions may be reversed to provide complementary devices. Semiconductors other than silicon may be substituted for silicon with appropriate changes in region spacings and widths.

Devices in accordance with this invention are preferably fabricated by first forming the various doped regions in the semiconductor body and then etching the trenches in which the gate electrodes are disposed. The trenches may be etched by reactive ion etching (RIE) or other techniques. The surfaces of the trenches are then oxidized and the conductive material of the gate electrodes deposited in the trenches. Additional information on the formation of the trenches may be found in the incorporated by reference patent applications.

Three different classes of embodiments of the present invention have been illustrated and described. Other embodiments may also be designed and features of two or more of the embodiments may be combined to form additional embodiments.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A lateral semiconductor device comprising:
    a body of semiconductor material having first and second opposed major surfaces, said body including:
        a first emitter region of one type conductivity extending to said first surface,
        a first base region of opposite type conductivity, disposed adjacent to and forming a first PN junction with said first emitter region and extending to said first surface,
        a second base region of said one type conductivity disposed adjacent to said first base region, forming a second PN junction with said first base region and spaced from said first emitter region,
        a second emitter region of said opposite type conductivity disposed adjacent to said second base region, forming a third PN junction with said second base region, spaced from said first base region and extending to said first surface;
    a first power electrode disposed on said first surface and ohmically contacting said first emitter region;
    a second power electrode disposed on said first surface and ohmically contacting said second emitter region;
    said device including a regenerative four-layer current path extending between said first and second power electrodes through said first emitter region, first and second base regions and said second emitter region and a non-regenerative three-layer current path extending between said first and second power electrodes through three of said four regions; and an insulated gate electrode disposed adjacent to a channel portion of one of said base regions, said channel portion being narrow enough that when current is flowing between said first and second power electrodes through said regenerative current path in a regenerative thyristor mode, application of an appropriate turn-off bias voltage to said gate electrode causes said channel portion of said one of said base regions to become sufficiently depleted of carriers to divert enough of said current from said regenerative current path into said non-regenerative current path to interrupt regenerative thyristor action in said regenerative current path to thereby turn said device off.

2. The semiconductor device recited in claim 1 wherein:

said first surface includes a plane portion and a trench portion, said trench portion comprising said first surface of said body where a trench extends into said body from said plane portion;

said one of said base regions extends to said trench portion of said first surface; and said gate electrode is disposed in said trench adjacent to said one of said base regions.

3. The semiconductor device recited in claim 2 wherein:

both said first and second base regions extend to said trench portion of said first surface; and said insulated gate electrode is disposed adjacent to both said first and second base regions in said trench.

4. The semiconductor device recited in claim 3 wherein:

said first and second emitter regions are spaced apart along said first surface and extend substantially parallel to each other in a first direction along said first surface;

said regenerative current path extends substantially perpendicular to said first direction; and said trench extends substantially parallel to said first direction.

5. The semiconductor device recited in claim 4 wherein said non-regenerative current path also extends substantially perpendicular to said first direction.

6. The semiconductor device recited in claim 4 wherein:

said channel portion of said one of said base regions is elongated and extends in said first direction.

7. The semiconductor device recited in claim 6 wherein:

said regenerative current path is shorter than said non-regenerative current path;

said regenerative and non-regenerative current paths have a common origin at one of said first and second power electrodes; and said regenerative current path terminates at the other of said first and second power electrodes at a location between said one of said power electrodes and the location at said other of said power electrodes at which said non-regenerative current path terminates.

8. The semiconductor device recited in claim 6 wherein:

said regenerative current path is longer than said non-regenerative current path;

said regenerative and non-regenerative current paths have a common origin at one of said first and second power electrodes; and said non-regenerative current path terminates at the other of said first and second power electrodes at a location between said one of said power electrodes and the location at said other of said power electrodes at which said regenerative current path terminates.

9. The semiconductor device recited in claim 4 wherein:

said trench comprises a plurality of segments spaced apart in said first direction;

said gate electrode comprises a corresponding plurality of gate electrode segments disposed in said trench segments; and said channel portion of said one of said base regions comprises a plurality of spaced apart segments, said channel segments being spaced apart in said first direction by said gate electrode segments.

10. The semiconductor device recited in claim 9 wherein:

a plurality of adjacent pairs of said gate segments are spaced apart by portions of said one of said base regions which are part of said non-regenerative current path and the configuration of said pairs of adjacent gate electrode segments and the intervening portions of said one of said base regions is such as to prevent pinch-off of said non-regenerative current path in response to application of said appropriate gate voltage to said gate electrode segments whereby said non-regenerative current path is not pinched off.

11. The semiconductor device recited in claim 9 wherein:

each pair of adjacent gate electrode segments is spaced apart by a portion of said one of said base regions through which said regenerative current path flows;

said gate electrode segments extend further into said semiconductor body than the other of said base regions; and the non-regenerative current path, at least during pinch-off of said regenerative current path, extends further into said semiconductor body than said gate electrode segments.

12. The semiconductor device recited in claim 2 wherein:

in said non-regenerative current path one of said power electrodes is disposed in Schottky contact with the corresponding base region.

13. The semiconductor device recited in claim 1 further comprising:

a substrate of one type conductivity semiconductor material on which said first base region is disposed and with which said first base region forms a PN junction.

14. The semiconductor device recited in claim 1 further comprising:

an insulating substrate on which said first base region is disposed.

15. The semiconductor device recited in claim 2 wherein:

said one of said base regions is said first base region;

said second emitter region is disposed in said second base region;

said second base region includes a channel portion disposed between said second emitter region and said first base region adjacent said first surface of said body;

said device further includes a second insulated gate electrode disposed on said first surface adjacent to said channel portion of said second base region for controlling the conductivity of said channel region for opposite type conductivity carriers between said second emitter region and said first base region.

16. The semiconductor device recited in claim 15 wherein:

said second power electrode also ohmically contacts said second base region.

17. The semiconductor device recited in claim 15 wherein:

said trench comprises a plurality of spaced apart segments;

the first recited insulated gate electrode comprises a corresponding plurality of gate electrode segments disposed in said trench segments; and said channel portion of said first base region comprises a plurality of segments which are spaced apart by said segments of said first recited gate electrode.

18. The semiconductor device recited in claim 17 wherein:

said first power electrode also contacts said first base region in locations which are spaced apart from its ohmic contacts to said first emitter region by the first recited insulated gate electrode, the portions of said first base region contacted by said first power electrode being coupled to said second base region by a path through said first base region that bypasses the channel portions.

19. The semiconductor device recited in claim 18 wherein:

said contacts between said first power electrode and said first base region are Schottky contacts.

20. The semiconductor device recited in claim 18 wherein:

said contacts between said first power electrode and said first base region are ohmic contacts.

21. The semiconductor device recited in claim 18 wherein:

said portions of said first base region which are contacted by said first power electrode are wider in a first direction than said channel portions of said first base region.

22. The semiconductor device recited in claim 15 wherein:

said second base region and said second emitter region are elongated in a first direction;

said trench comprises parallel segments elongated in said first direction;

said first base region comprises segments elongated in said first direction and, in a second direction perpendicular to said first direction, bounded on both sides by said first gate electrode segments; and at selected locations in said first direction, said first power electrode contacts said first base region.

23. The semiconductor device recited in claim 1 wherein:

said non-regenerative current path includes a low lifetime portion in one of said base regions situated outside of said regenerative current path.

* * * * *